United States Patent
Hanafi et al.

(10) Patent No.: US 7,089,515 B2
(45) Date of Patent: Aug. 8, 2006

(54) THRESHOLD VOLTAGE ROLL-OFF COMPENSATION USING BACK-GATED MOSFET DEVICES FOR SYSTEM HIGH-PERFORMANCE AND LOW STANDBY POWER

(75) Inventors: Hussein I. Hanafi, Basking Ridge, NJ (US); Robert H. Dennard, New Rochelle, NY (US); Wilfried E. Haensch, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 10/796,805

(22) Filed: Mar. 9, 2004

(65) Prior Publication Data

US 2005/0204319 A1     Sep. 15, 2005

(51) Int. Cl.
*G06F 17/50* (2006.01)
(52) U.S. Cl. .............................. 716/4; 716/1
(58) Field of Classification Search ............... 716/4, 716/1
See application file for complete search history.

(56) References Cited

U.S. PATENT DOCUMENTS

| | | | | |
|---|---|---|---|---|
| 4,260,909 A | * | 4/1981 | Dumbri et al. | 327/537 |
| 4,542,485 A | * | 9/1985 | Iwahashi et al. | 365/189.09 |
| 5,622,880 A | * | 4/1997 | Burr et al. | 438/194 |
| 6,023,641 A | * | 2/2000 | Thompson | 607/9 |
| 6,472,919 B1 | * | 10/2002 | Burr | 327/210 |

* cited by examiner

*Primary Examiner*—Sun James Lin
(74) *Attorney, Agent, or Firm*—Scully, Scott, Murphy & Presser, P.C.; Wan Yee Cheung, Esq.

(57) ABSTRACT

A method for compensating the threshold voltage roll-off using transistors containing back-gates or body nodes is provided. The method includes designing a semiconductor system or chip having a plurality of transistors with a channel length of $L_{nom}$. For the present invention, it is assumed that the channel length of these transistors at the completion of chip manufacturing is $L_{max}$. This enables one to set the off-current to the maximum value of $I\text{-off}_{max}$ which is done by setting the threshold voltage value to $Vt_{min}$. The $Vt_{min}$ for these transistors is obtained during processing by using the proper implant dose. After manufacturing, the transistors are then tested to determine the off-current thereof. Some transistors within the system or chip will have an off-current value that meets a current specification. For those transistor devices, no further compensation is required. For other transistors within the system or chip, the off-current is not within the predetermined specification. For those transistors, threshold voltage roll-off has occurred since they are transistors that have a channel length that is less than nominal. For such short channel transistors, the threshold voltage is low, even lower than $Vt_{min}$, and the off-current is high, even higher than $I\text{-off}_{max}$. Compensation of the short channel transistors is achieved in the present invention by biasing the back-gate or body node to give increased threshold voltage about equal to $Vt_{min}$ and hence an off-current that meets the predetermined specification, which is about equal to $I\text{-off}_{max}$.

13 Claims, 2 Drawing Sheets

THRESHOLD VOLTAGE ROLL-OFF COMPENSATION USING BACK-GATED MOSFET DEVICES FOR SYSTEM HIGH-PERFORMANCE AND LOW STANDBY POWER

FIELD OF THE INVENTION

The present invention relates to complementary metal oxide semiconductor (CMOS) devices, and more particularly to an integrated circuit (IC) that includes metal oxide semiconductor field effect transistors (MOSFETs) in which the back-gates or body nodes of the MOSFETs are 'statically' biased to obtain system high-performance, while maintaining low system standby power.

BACKGROUND OF THE INVENTION

Clock gating is used in high performance semiconductor systems to reduce average active power by idling functional units and preventing wasteful events. This is disclosed, for example, in the article to N. Kurd, et al. entitled Multi-GHz Clocking Scheme for Intel® Pentium® 4 Microprocessor", ISSCC Digest of Technical Papers, 2001, p. 404. However, with technology scaling, leakage power of idle units becomes a large fraction of the total chip power. As a result, the overall power savings achievable by clock gating alone is diminishing.

Dynamic MOSFET threshold voltage (Vt) control schemes to meet the opposing requirements of high-performance, during system functional units active periods, and low power, during system functional units idle periods, have been proposed. See, for example, co-assigned and co-pending U.S. application Ser. No. 10/639,942, filed Aug. 13, 2003, entitled "Device Threshold Control of Front-Gate Silicon-On-Insulator MOSFET using a Self-Aligned Back-Gate"; and the article to J. Tschang, et al., entitled "Dynamic-Sleep Transistor and Body Bias for Active Leakage Power Control of Microprocessors", ISSCC Digest of Technical Papers, 2003, p. 102.

In these prior art schemes, back-gated (SOI technology) or body node (bulk technology) MOSFETs are employed. By applying the proper bias to the nMOSFET back-gate or body node, its threshold voltage can be dynamically changed from low values ($\leq 0$ Volts), during system active periods for maximum performance, to high values ($\geq 0.2$ Volts) during system idle periods for minimum leakage power. For pMOSFETs, the opposite voltages are applicable.

The overall performance impact of these dynamic leakage control techniques on the system is dictated by the time required to switch the transistor back-gate or body node voltage during "idle" or "active" transitions. This time can be as large as several clock cycles. Also, for any of these dynamic leakage control techniques, to achieve reduction in the overall power, the leakage energy saved during the "idle" period must be larger than any energy overhead incurred during switching the transistor back-gates or body nodes between "idle" and "active" modes. The minimum "idle" time required to achieve overall power saving is dictated by the energy spent in switching the back-gate or body nodes and may account to several additional clock cycles.

It is an object of the present invention to provide a methodology in which the back-gates or body nodes of MOSFETs in a system or chip can be 'statically' biased for high performance and low standby power.

SUMMARY OF THE INVENTION

In view of the aforementioned objective, the present invention provides a method whereby the back-gates or body nodes of MOSFETs in a system or chip are 'statically' biased to obtain a high performance system or chip, while maintaining low system or chip standby power. In particular, a method is provided in which the static bias of a nominal MOSFET comprising either a back-gate or a body node is first determined and thereafter the determined static bias is introduced on the system or chip. The term "nominal" is used throughout the present application to indicate that all device parameters such as, for example, channel length, and gate oxide thickness, assume their average or mean values for a particular technology. For example, in current technology, the nominal channel length, $L_{nom}$, is 25 nm. However, due to process variations, the channel length of current MOSFETs can have a nominal maximum length, $L_{max}$, of 32.5 nm, and a nominal minimum channel length, $L_{min}$, of 17.5 nm.

For devices in which the channel length is $L_{nom}$, the threshold voltage, Vt, is equal to $Vt_{nom}$ and the off-current, I-off is also equal to $I\text{-off}_{nom}$. For devices in which the channel length is $L_{max}$, the threshold voltage is equal to $Vt_{max}$ and the off-current is equal to $I\text{-off}_{min}$. For devices in which the channel length is $L_{min}$, the threshold voltage is equal to $Vt_{min}$ and the off-current is equal to $I\text{-off}_{max}$.

Transistors that have a channel length above nominal are referred to herein as long channel devices, whereas transistors that have a channel length less than nominal are referred to herein as short channel devices. The longer channel devices typically have a higher threshold voltage and lower off-current than shorter channel devices.

The method of the present invention is based on the use of the back-gate or body node bias to compensate MOSFET threshold voltage roll-off. The term threshold voltage (i.e., Vt) roll-off is used herein to denote the different device threshold voltages that can exist within a system or chip caused by process variations that effect the channel length of each transistor.

In the present invention, a semiconductor system or chip having a plurality of transistors is designed with the channel length of $L_{nom}$. In accordance with the present invention, it is assumed that the channel length of these transistors at the completion of chip manufacturing is $L_{max}$. This enables one to set the off-current to the maximum value of $I\text{-off}_{max}$ which is done by setting the threshold voltage value to $Vt_{min}$. The $Vt_{min}$ for these transistors is obtained during processing by using the proper implant dose. After manufacturing, the transistors are then tested to determine the off-current thereof. Some transistors within the system or chip will have an off-current value that meets a current specification. For those transistor devices, no further compensation is required. For other transistors within the system or chip, the off-current is not within the predetermined specification. For those transistors, threshold voltage roll-off has occurred since they are transistors that have a channel length that is less than nominal. For such short channel transistors, the threshold voltage is low, even lower than $Vt_{min}$, and the off-current is high, even higher than $I\text{-off}_{max}$. Compensation of the short channel transistors is achieved in the present invention by biasing the back-gate or body node to give increased threshold voltage that is about equal to $Vt_{min}$ and hence an off-current that meets the predetermined specification, which is about equal to $I\text{-off}_{max}$.

In broad terms, the method of the present invention comprises the steps of:

designing a semiconductor chip or system having a plurality of transistor devices in which the channel length of each transistor device is equal to $L_{nom}$;

setting off-current of each transistor device to $I\text{-off}_{max}$ by predeterming that each transistor device has a channel length equal to $L_{max}$ and then implanting into each channel of each transistor such that threshold voltage is equal to $Vt_{min}$;

testing the off-current of each transistor device; and biasing the back-gate or the body nodes of some transistor devices that have an off-current that does not meet a preselected specification of about $I\text{-off}_{max}$ to increase the threshold voltage to about $Vt_{min}$ thereof thereby compensating threshold voltage roll-off within said semiconductor chip or system.

In the present invention, the threshold voltage of each transistor device present in the chip or system is set assuming that each transistor has its nominal maximum value of channel length. The threshold voltage of each transistor device is thus set to an off-current that meets a preselected specification of $I\text{-off}_{max}$. In this step of the present invention, the threshold voltage of the transistor devices is set by implanting into the channel region of the transistor devices. The degree of threshold voltage setting can be controlled by preselecting the implant conditions and ion dosage used.

After setting the threshold voltage of each transistor device within the chip or system to $Vt_{min}$, the threshold voltage of each transistor device can be measured after manufacturing. Some transistors will not need any further adjusting, others will require additional adjusting. The additional adjusting is performed by biasing the back-gate or the body node (i.e., well region) of the transistor. The biasing occurs after manufacturing of the semiconductor chip or system during testing thereof or it can be done at a later time.

Biasing may be achieved by an external DC voltage source, an internal circuit that can deliver a potential to the back-gate or the body node of the second transistors or by an external clock system that can deliver a potential.

DETAILED DESCRIPTION OF THE INVENTION

Figure 1:
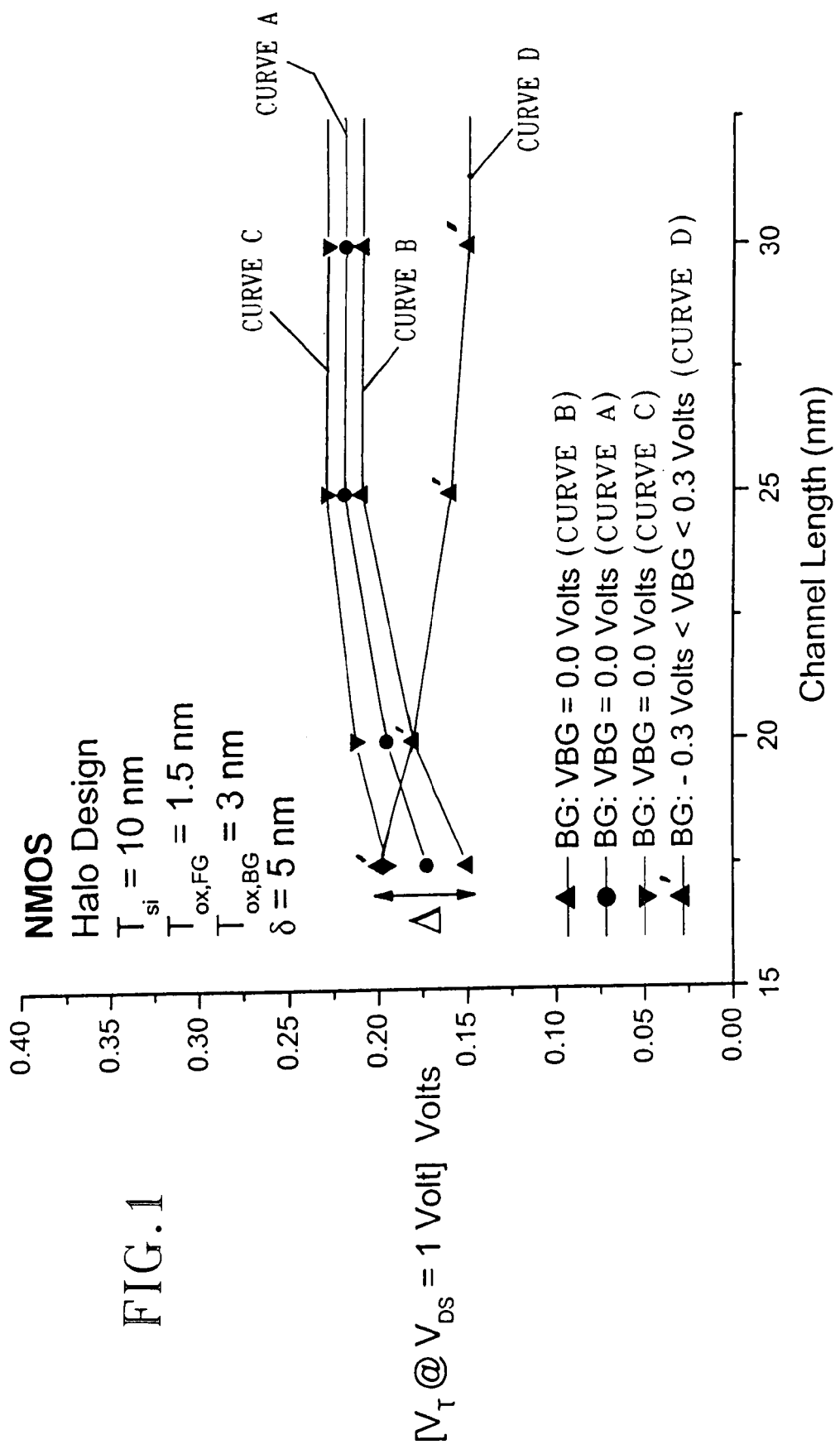
FIG. 1 is a graph of threshold voltage roll-off Vt @ $V_{DS}=1$ volt (Volt) vs. channel length (nm) for a nominal double-gated MOSFET device.

The present invention, which provides a method for statically biasing the back-gates or the body nodes of MOSFETs to obtain system high performance, while maintaining low system standby power, will now be described with reference to the drawings that accompany the present application. The drawings represent one possible implementation of the present invention.

As indicated above, the present invention provides a method for statically biasing the back-gates or the body nodes of MOSFETs to obtain system high performance, while maintaining low system standby power. The inventive method is based on the use of the back-gate or the body node of an MOSFET to compensate MOSFET device threshold roll-off which is caused by variations in device parameters during fabrication of the transistors. The inventive methodology is based on adjusting the threshold voltage during processing by first assuming that each transistor has its nominal maximum channel length and implanting into the channel region of each transistor. After manufacturing, additional adjustments in threshold voltage is made to those devices not meeting a pre-selected off-current value by biasing the back-gates or the body nodes of those transistors.

The inventive method of threshold voltage compensation begins with first designing a semiconductor chip or semiconductor system that includes a plurality of transistor devices that have a channel length equal to the nominal channel length value. The transistor devices formed in the present invention are either back-gate devices or devices that include a body node (i.e., n-well or p-well). The transistors are typically MOSFETs that include a gate conductor, at least one gate dielectric, and a channel region located beneath the gate conductor.

The back-gate devices are formed utilizing techniques well known to those skilled in the art. One such process of forming a back-gated device is disclosed, for example, in U.S. patent application Ser. No. 10/639,942, filed Aug. 13, 2002, the contents of which are incorporated herein by reference. Back-gate devices are typically characterized as MOSFET devices having a front gate and a back gate that are separated from a Si channel by gate dielectrics.

The devices containing body nodes are formed utilizing conventional complementary metal oxide semiconductor (CMOS) processing schemes that are well known to those skilled in the art. The body node devices are generally characterized as a bulk MOSFET device in which the substrate node can be biased to adjust the device threshold.

In typical transistor devices, the channel length ranges in value from a nominal minimum value to a nominal maximum value. This variation in channel length is due to process variations that exist during the fabrication of each transistor. The nominal value of transistor channel length, $L_{nom}$, is based on the technology being used. For today's technology, the nominal channel length is 25 nm. Because of process variations however, the transistors have a channel length that can vary from 17.5 nm (nominal minimum) to 32.5 nm (nominal maximum). Those transistors that have channel lengths above nominal are referred to long channel devices, while the transistors that have channel lengths less than nominal are referred to as short channel devices.

As known to those skilled in the art, the threshold voltage of longer channel devices is typically greater than the threshold voltage of shorter channel devices. As a consequence, the longer channel devices have a lower off-current than the off-current of shorter channel devices. Consequently, a methodology is needed to compensation for the variation in threshold voltage that can exists in a semiconductor chip or system.

During the manufacturing of the semiconductor chip or system, the threshold voltage of the transistor devices is compensated (i.e., adjusted) by first assuming that each transistor device has its nominal maximum channel length and then implanting into the channel region such that each transistor device has substantially the same threshold voltage of about $Vt_{min}$ and an off-current that meets a preselected specification of about $I\text{-off}_{max}$.

The exact values of the threshold voltage achieved after this compensation step may vary from semiconductor chip to semiconductor chip. Typically, however, the threshold voltage that is achieved after the compensating step is from about 50 to about 450 millivolts, with a threshold voltage from about 100 to about 150 millivolts being more typical.

Likewise, the off-current achieved after the compensating step may vary from semiconductor chip to semiconductor chip. Typical values of off-current that can be achieved after the compensating step are from about 50 to about 150 nA/µm, with an off-current after compensation of about 100 nA/µm being more typical. Although these ranges for off-current are specifically provided, the present invention can be used to achieve any preselected off-current that may be required.

In this step of the present invention, the threshold voltage of any long channel devices would be compensated by lower the threshold voltage of those transistors such that the long channel devices have a threshold voltage that is substantially equal to the threshold voltage of the short channel devices. During this step of the present invention in which the threshold voltage of any long channel devices is lowered, the off-current of those transistor devices is also increased to a value that substantially matches that of the short channel devices.

The threshold voltage of the transistor devices is compensated by implanting either an n-or p-type dopant into the channel region of each device. Suitable n-type dopants that can be employed in the present invention include, but are not limited to Group V dopants such as, for example, As, Sb, and/or P, while suitable p-type dopants that are employed in the present invention include Group III dopants such as B.

The degree of compensation can be controlled by preselecting the implant conditions and the ion dosage used in this embodiment of the present invention. The implant conditions employed in the present may vary over wide ranges and are dependent upon the ion that is being implanted and the degree of threshold voltage adjustment needed. Typical implant conditions that can be used in the present invention are as follows: implanting at an energy from about 5 to about 30 keV.

The ion dosage that can be employed in the present invention may vary depending upon the degree of compensation required as well as the type of ion that is being implanted into the channel region of the longer channel devices. For example, when p-type dopants are employed the ion dosage employed in the present invention can be from about 1E11 to about 1E13 atoms/cm$^2$. When n-type dopants are employed, the ion dosage is typically from about 1E11 to about 1E13 atoms/cm$^2$.

After the first compensation step, and at a time after manufacturing, the threshold voltage of the transistor devices requiring further adjusting can be made, during or after testing, by biasing the back-gate or the body node thereof. The biasing increases the threshold voltage of shorter channel devices to a value such that the off-current thereof also increases.

In this step of the present invention, the biasing of the back-gates or body nodes may be achieved by an external DC voltage source, an internal circuit that can deliver a potential to the back-gate or the body node of the second transistors or by an external clock system that can deliver a potential.

When an external clock system is used in this step of the present invention, the biasing can be achieved by comparing the system clock to the output of an on-chip running oscillator. The use of the external clock has the advantage of a temperature self-adjusting back bias voltage.

The above description provides an overview of the method of the present invention. The following description, which makes reference to FIGS. 1 and 2, provide one application of the method of the present invention for a NMOS transistor having a halo design.

Figure 2:
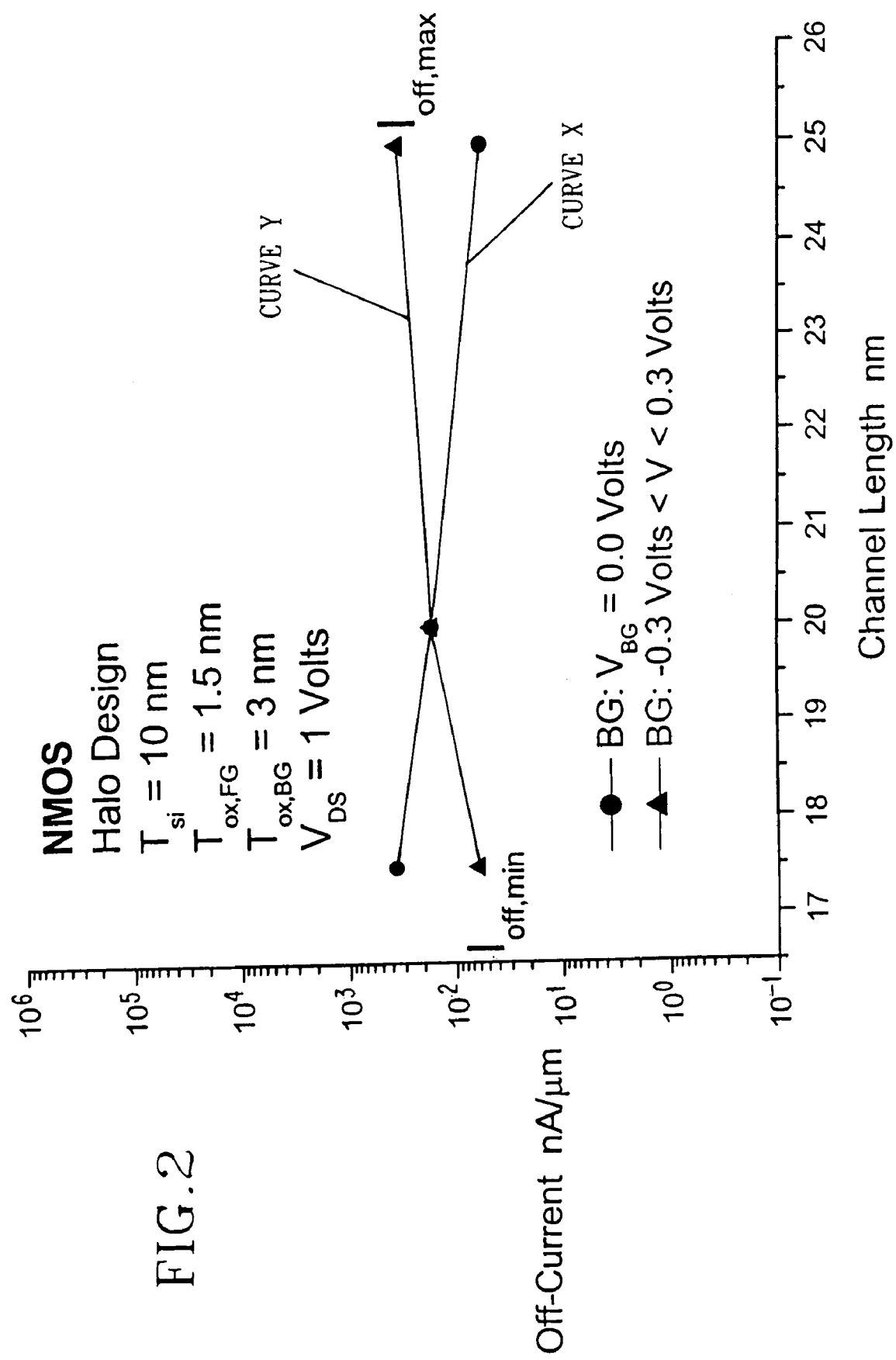
FIG. 2 is a graph showing the nominal device off-current (nA/μm) vs. channel length (nm).

Reference is made to FIG. 1 which is a graph of threshold voltage roll-off Vt @ V$_{DS}$=1 volt (Volt) vs. channel length (nm) for a nominal double-gated MOSFET device. In FIG. 1, Curve A denotes the Vt roll-off for a nominal double-gate MOSFET device with, as an example, a channel length L$_{chan}$=25 nm (±7.5 nm), a front gate with T$_{inv,FG}$=1.5 nm, a back gate with T$_{inv,BG}$=to 3.0 nm and a silicon thickness T$_{Si}$=10 nm. Curve B and Curve C of FIG. 1 show the worst and best case Vt roll-off due to a ±3 sigma variations in various process parameters such as source/drain junction depth, gate oxide thickness, channel implant dose and energy, halo implant dose and energy, and doping fluctuations. Note that as the channel length decreases, the variation in the device threshold increases since the variations in the process parameters have a more pronounced impact on the smaller channel length devices. CURVE X of FIG. 2 shows the worst case process device off-current as a function of channel length that corresponds to the Vt roll-off characteristics shown in Curve B of FIG. 1. Curve Y of FIG. 2 shows, as an example, that the off-current of the minimum channel device, L$_{chan}$=17.5 nm, is 350 nA/µm at V$_{DS}$=1 Volts. For the following discussion, assume that the required maximum device off-current is I-off$_{max}$ (~350 nA/µm at V$_{DS}$=1 Volts) including all device variations such as: gate oxide thickness, channel implant and halo implant doses, doping fluctuations, . . . etc. To meet this requirement, the following techniques can be used:

1) First, using proper channel implant dose, the threshold voltage of the longer channel devices are adjusted (L$_{chan}$=32.5 nm) to obtain the required off-current I-off$_{max}$ as shown in Curve D of FIG. 1 and Curve X of FIG. 2.
2) second, adjusting the back-gate bias for only the shorter devices (L$_{chan}$<32.5 nm) to increase their threshold voltage as shown in Curve D of FIG. 1. The threshold voltage shift Δ shown in FIG. 1 is chosen such that I-off$_{min}$ (Curve Y of FIG. 2) is equal I-off$_{max}$ under worst case device variations condition. This back-gate bias can be supplied externally or generated on chip by comparing the system clock to the output of an on-chip free running oscillator. The later case has the advantage of a temperature self adjusting back-bias voltage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method for compensating threshold voltage roll-off within a semiconductor chip or system comprising:
    designing a semiconductor chip or system having a plurality of transistor devices in which channel length of each transistor device is equal to L$_{nom}$;
    setting off-current of each transistor device to I-off$_{max}$ by predetermining that each transistor device has a channel length equal to L$_{max}$ and then implanting into each channel of each transistor device such that its threshold voltage is equal to Vt$_{min}$;
    testing off-current of each transistor device; and
    biasing the back gate or body nodes of some transistor devices, each of which has an off-current that does not meet a preselected specification of about I-off$_{max}$, to increase threshold voltage of each of said transistor devices to about Vt$_{min}$ thereof thereby compensating the threshold voltage roll-off within said semiconductor chip or system.

2. The method of claim 1 wherein $L_{nom}$ is 25 nm.

3. The method of claim 1 wherein the setting off-current is controlled by varying implant conditions and ion dosage.

4. The method of claim 3 wherein the implanting is performed at an energy from about 5 keV to about 30 keV.

5. The method of claim 3 wherein the ion dosage for a p-type dopant is from about 1E11 atoms/cm$^2$ to about 1E14 atoms/cm$^2$.

6. The method of claim 3 wherein the ion dosage for an n-type dopant is from about 1E11 atoms/cm$^2$ to about 1E14 atoms/cm$^2$.

7. The method of claim 3 wherein the implanting comprises a p-type dopant selected from ions of Group III elements.

8. The method of claim 3 wherein the implanting comprises an n-type dopant selected from ions of Group V elements.

9. The method of claim 1 wherein the biasing occurs after manufacturing of the semiconductor chip or system during the testing thereof.

10. The method of claim 1 wherein the biasing occurs at a time after manufacturing of the semiconductor chip or system and after the testing thereof.

11. The method of claim 1 wherein the biasing is achieved by an external DC voltage source.

12. The method of claim 1 wherein the biasing is achieved by an internal circuit that can deliver a potential to the back gate or the body nodes of some transistor devices.

13. The method of claim 1 wherein the biasing is achieved by an external clock system that can deliver a potential.

* * * * *